(12) United States Patent
Hartig

(10) Patent No.: US 7,342,716 B2
(45) Date of Patent: Mar. 11, 2008

(54) MULTIPLE CAVITY LOW-EMISSIVITY COATINGS

(75) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

(21) Appl. No.: 11/398,345

(22) Filed: Apr. 5, 2006

(65) Prior Publication Data

US 2007/0081228 A1    Apr. 12, 2007

Related U.S. Application Data

(63) Continuation-in-part of application No. 11/360,266, filed on Feb. 23, 2006.

(60) Provisional application No. 60/725,891, filed on Oct. 11, 2005.

(51) Int. Cl.
*F21V 9/04* (2006.01)

(52) U.S. Cl. .................. 359/360; 359/359; 359/580; 359/589; 359/605; 359/850

(58) Field of Classification Search .............. None
See application file for complete search history.

(56) References Cited

U.S. PATENT DOCUMENTS

| | | | |
|---|---|---|---|
| 3,272,986 A | 9/1966 | Schmidt | 136/206 |
| 3,649,359 A | 3/1972 | Apfel | |
| 3,962,488 A | 6/1976 | Gillery | 427/109 |
| 3,990,784 A | 11/1976 | Gelber | |
| 4,017,661 A | 4/1977 | Gillery | 428/412 |
| 4,045,125 A | 8/1977 | Farges | |
| 4,098,956 A | 7/1978 | Blickensderfer | 428/627 |
| 4,101,200 A | 7/1978 | Daxinger | |
| 4,166,018 A | 8/1979 | Chapin | 204/192.12 |
| 4,169,655 A | 10/1979 | Jacobsson | |
| 4,194,022 A | 3/1980 | Gillery | 427/109 |
| 4,204,942 A | 5/1980 | Chahroudi | 204/298 |
| 4,337,990 A | 7/1982 | Fan | 359/360 |
| 4,379,040 A | 4/1983 | Gillery | 204/192.13 |
| 4,413,877 A | 11/1983 | Suzuki | 359/360 |
| 4,462,883 A | 7/1984 | Hart | 204/192 |
| 4,497,700 A | 2/1985 | Groth | 204/192 |
| 4,546,050 A | 10/1985 | Amberger | 428/630 |
| 4,556,599 A | 12/1985 | Sato | |
| 4,619,729 A | 10/1986 | Johncock | 430/128 |
| 4,622,120 A | 11/1986 | Gillery | 204/192 |

(Continued)

FOREIGN PATENT DOCUMENTS

DE    716153    1/1942

(Continued)

OTHER PUBLICATIONS

Saturation (color theory), Wikipedia.org, <http://en.wikipedia.org/wiki/saturation_%28color_theory%29>, retreived Dec. 21, 2006.*

(Continued)

*Primary Examiner*—Stephone B. Allen
*Assistant Examiner*—Derek S. Chapel
(74) *Attorney, Agent, or Firm*—Fredrikson & Byron, P.A.

(57) ABSTRACT

Multiple cavity low-emissivity coatings. The coating includes three infrared-reflection film regions, which may each include silver.

22 Claims, 6 Drawing Sheets

U.S. PATENT DOCUMENTS

| | | | |
|---|---|---|---|
| 4,715,879 A | 12/1987 | Schmitte | 65/60.2 |
| 4,737,379 A | 4/1988 | Hudgens | 427/575 |
| 4,790,922 A | 12/1988 | Huffer | 204/192 |
| 4,806,220 A | 2/1989 | Finley | 204/192 |
| 4,859,532 A | 8/1989 | Oyama | 428/336 |
| 4,898,789 A | 2/1990 | Finley | |
| 4,898,790 A | 2/1990 | Finley | 428/623 |
| 4,902,081 A | 2/1990 | Huffer | |
| 4,943,484 A | 7/1990 | Goodman | |
| 4,960,310 A | 10/1990 | Cushing | |
| 4,965,121 A | 10/1990 | Young | |
| 4,996,105 A | 2/1991 | Oyama | 428/336 |
| 5,059,295 A | 10/1991 | Finley | 204/192 |
| 5,071,206 A | 12/1991 | Hood | 359/360 |
| 5,110,662 A | 5/1992 | Depauw | 428/192 |
| 5,201,926 A | 4/1993 | Szczyrbowski | |
| 5,229,881 A | 7/1993 | Day | |
| 5,279,722 A | 1/1994 | Szczyrbowski | 204/192 |
| 5,296,302 A | 3/1994 | O'Shaughnessy | 428/472 |
| 5,332,888 A | 7/1994 | Tausch | 219/547 |
| 5,337,191 A | 8/1994 | Austin | 359/885 |
| 5,344,718 A | 9/1994 | Hartig | |
| 5,425,861 A | 6/1995 | Hartig | |
| 5,514,485 A | 5/1996 | Ando | 428/702 |
| 5,557,462 A | 9/1996 | Hartig | |
| 5,591,529 A | 1/1997 | Braatz | 428/457 |
| 5,595,825 A | 1/1997 | Guiselin | 428/428 |
| 5,770,321 A | 6/1998 | Hartig | |
| 5,800,933 A | 9/1998 | Hartig et al. | |
| 5,965,246 A | 10/1999 | Guiselin | 428/212 |
| 6,007,901 A | 12/1999 | Maschwitz | 428/216 |
| 6,014,872 A | 1/2000 | Hartig | |
| 6,059,909 A | 5/2000 | Hartig | |
| 6,090,481 A | 7/2000 | Depauw | |
| 6,104,530 A | 8/2000 | Okamura | 359/359 |
| 6,235,398 B1 | 5/2001 | Nakamura | |
| 6,262,830 B1 | 7/2001 | Scalora | 359/248 |
| RE37,446 E | 11/2001 | Miyazaki | |
| 6,316,110 B1 | 11/2001 | Anzaki | 428/432 |
| 6,340,529 B1 | 1/2002 | Ebisawa et al. | |
| 6,343,167 B1 | 1/2002 | Scalora | 385/37 |
| 6,346,174 B1 | 2/2002 | Finley | 204/192.15 |
| 6,432,545 B1 | 8/2002 | Schicht | |
| 6,533,904 B2 | 3/2003 | Ebisawa | 204/192 |
| 6,569,516 B1 | 5/2003 | Nakamura | |
| 6,576,349 B2 | 6/2003 | Lingle | |
| 6,582,809 B2 | 6/2003 | Boire | |
| 6,650,478 B1 | 11/2003 | DeBusk | 359/585 |
| 6,680,134 B2 | 1/2004 | Maurer | |
| 6,830,791 B1 | 12/2004 | Misonou | |
| 6,838,159 B2 | 1/2005 | Eby | 428/216 |
| 6,855,369 B2 | 2/2005 | Nakamura | 427/164 |
| 6,919,133 B2 | 7/2005 | Hartig | |
| 6,992,826 B2 | 1/2006 | Wang | |
| 2001/0031365 A1 | 10/2001 | Anderson | |
| 2001/0044489 A1 | 11/2001 | Hugo | |
| 2002/0021495 A1 | 2/2002 | Lingle | 359/585 |
| 2002/0031674 A1 | 3/2002 | Laird | |
| 2002/0086164 A1 | 7/2002 | Anzaki | 428/432 |
| 2002/0102352 A1 | 8/2002 | Hartig | |
| 2002/0118460 A1 | 8/2002 | Woolf | |
| 2002/0136905 A1 | 9/2002 | Medwick | |
| 2003/0180547 A1 | 9/2003 | Buhay | 428/434 |
| 2003/0235719 A1 | 12/2003 | Grimal | |
| 2004/0009356 A1 | 1/2004 | Medwick | 428/432 |
| 2004/0115443 A1 | 6/2004 | Bond | |
| 2004/0126591 A1 | 7/2004 | Schicht | |
| 2004/0247929 A1 | 12/2004 | Buhay | 428/621 |
| 2007/0081227 A1 | 4/2007 | Hartig | |
| 2007/0082124 A1 | 4/2007 | Hartig | |
| 2007/0082168 A1 | 4/2007 | Hartig | |
| 2007/0082169 A1 | 4/2007 | Hartig | |
| 2007/0082186 A1 | 4/2007 | Hartig | |
| 2007/0082206 A1 | 4/2007 | Hartig | |

FOREIGN PATENT DOCUMENTS

| | | |
|---|---|---|
| DE | 42 11 363 | 10/1993 |
| DE | 19751711 | 5/1999 |
| EP | 0 035 906 | 9/1981 |
| EP | 0 456 487 | 11/1991 |
| EP | 0 567 735 | 11/1993 |
| EP | 1 044 934 | 10/2000 |
| EP | 1155816 | 11/2001 |
| EP | 1179516 A1 | 2/2002 |
| FR | 2 669 325 | 5/1992 |
| FR | 2859721 | 3/2005 |
| FR | 2862961 | 6/2005 |
| GB | 2 027 925 | 2/1980 |
| GB | 2080339 | 2/1982 |
| GB | 2126256 | 3/1984 |
| GB | 2300133 | 10/1996 |
| JP | 58-202408 | 11/1983 |
| JP | 3-503755 | 8/1991 |
| JP | 07-149545 | 6/1995 |
| WO | 90/02653 | 3/1990 |
| WO | 90/05439 | 5/1990 |
| WO | 90/08334 | 7/1990 |
| WO | WO9748649 A1 | 12/1997 |
| WO | WO 03093188 | 11/2003 |
| WO | WO2004061151 A1 | 7/2004 |
| WO | WO2005003049 A1 | 1/2005 |
| WO | WO2006041924 A2 | 4/2006 |
| WO | WO2006080968 A2 | 8/2006 |
| WO | WO2006105419 | 10/2006 |

OTHER PUBLICATIONS

Macleod, Thin Film Optical Filters, 3rd Edition, "Band Pass Filters", Chapter 7, pp. 257-347.

PPG Glass Technology Since 1883 brochure, Sep. 2003.

Solarban® Solar Control Low-E Glass 70XL, Oct. 2005, 2 pgs.

Solarban® 70XL Solar Control Low-E Glass, http://corporateportal.ppg.com/na/ideascapes/Solarban70XL, retrieved Jan. 15, 2006, 9 pgs.

U.S. Appl. No. 11/360,266, entitled "Low-Emissivity Coatings Having High Visible Transmission and Low Solar Heat Gain Coefficient," filed Feb. 23, 2006.

U.S. Appl. No. 11/546,152, entitled "Methods and Equipment for Depositing High Quality Reflective Coatings," filed Oct. 11, 2006.

U.S. Appl. No. 11/545,323, entitled "High Infrared Reflection Coatings," filed Oct. 10, 2006.

U.S. Appl. No. 11/545,212, entitled "High Infrared Reflection Coatings and Thin Film Coating Deposition Methods," filed Oct. 10, 2006.

U.S. Appl. No. 11/545,231, entitled "High Infrared Reflection Coatings and Associated Technologies," filed Oct. 10, 2006.

U.S. Appl. No. 11/545,211, entitled "High Infrared Reflection Coatings, Thin Film Coating Deposition Methods, and Associated Technologies," filed Oct. 10, 2006.

English-language abstract for JP 07-149545.

English-language abstract for JP 58-202408.

English-language abstract for JP 3-503755.

English-language abstract for EP 0 303 109.

English-language abstract for DE 42 11 363.

English-language abstract for FR 2 669 325.

Affidavit of Brian R. Basso, Nov. 9, 2007, 3 pages.

\* cited by examiner

MULTIPLE CAVITY LOW-EMISSIVITY COATINGS

RELATED APPLICATIONS

The present application claims priority to U.S. utility application Ser. No. 11/360,266, filed on Feb. 23, 2006 ("the '266 application"), and to U.S. provisional application No. 60/725,891, filed on Oct. 11, 2005, the entire contents of each which are incorporated herein by reference. The present application is a continuation-in-part of the '266 application.

FIELD OF THE INVENTION

The present invention relates to thin film coatings for glass and other substrates. In particular, this invention relates to low-emissivity coatings that are reflective of infrared radiation. Also provided are methods and equipment for depositing thin film coatings.

BACKGROUND OF THE INVENTION

Low-emissivity coatings are well known in the art. Typically, they include one or two layers of infrared-reflection film and two or more layers of transparent dielectric film. The infrared-reflection film, which generally is a conductive metal like silver, gold, or copper, reduces the transmission of heat through the coating. The dielectric film is used to antireflect the infrared-reflection film and to control other properties and characteristics of the coating, such as color and durability. Commonly used dielectric materials include oxides of zinc, tin, indium, bismuth, and titanium, among others.

Most commercially available low-emissivity coatings have one or two silver layers each sandwiched between two coats of transparent dielectric film. Increasing the number of silver films in a low-emissivity coating can increase its infrared reflection. However, this can also reduce the visible transmission of the coating, and/or negatively impact the color of the coating, and/or decrease the durability of the coating. Perhaps for these reasons, low-emissivity coatings with three silver layers have not found much place in the market.

It would be desirable to provide a low-emissivity coating that includes three infrared-reflection film regions. It would be particularly desirable to provide a low-emissivity coating of this nature that has desirable coating properties and characteristics.

SUMMARY OF THE INVENTION

In certain embodiments, the invention provides a transparent substrate having two generally opposed major surfaces with a multiple cavity low-emissivity coating on a desired one of the major surfaces. The coating comprises, in sequence from the desired major surface outward, a first transparent dielectric film region, a first infrared-reflection film region, a second transparent dielectric film region, a second infrared-reflection film region, a third transparent dielectric film region, a third infrared-reflection film region, and a fourth transparent dielectric film region. In the present embodiments, the coating has a metal/dielectric ratio of at least 0.22. The metal/dielectric ratio is defined as the combined thickness of the first, second, and third infrared-reflection film regions divided by the combined thickness of the first, second, third, and fourth transparent dielectric film regions.

Some embodiments of the invention provide a transparent substrate having two generally opposed major surfaces with a multiple cavity low-emissivity coating on a desired one of the major surfaces. The coating comprises, in sequence from the desired major surface outward, a first transparent dielectric film region, a first infrared-reflection film region, a second transparent dielectric film region, a second infrared-reflection film region, a third transparent dielectric film region, a third infrared-reflection film region, and a fourth transparent dielectric film region. In the present embodiments, the coating preferably has a metal/dielectric ratio of at least 0.25. The metal/dielectric ratio is defined as the combined thickness of the first, second, and third infrared-reflection film regions divided by the combined thickness of the first, second, third, and fourth transparent dielectric film regions. Preferably, the transparent substrate is part of a multiple-pane insulating glazing unit that includes a second pane, the unit has at least one between-pane space, and the desired major surface is exposed to a between-pane space of the unit. In the present embodiments, the insulating glazing unit preferably has an exterior reflected color characterized by an $a_h$ color coordinate of between about +1.5 and about −2 and a $b_h$ color coordinate of between about 0 and about −3.

Certain embodiments of the invention provide a transparent substrate having two generally opposed major surfaces with a multiple cavity low-emissivity coating on a desired one of the major surfaces. The coating comprises, in sequence from the desired major surface outward, a first transparent dielectric film region, a first infrared-reflection film region, a second transparent dielectric film region, a second infrared-reflection film region, a third transparent dielectric film region, a third infrared-reflection film region, and a fourth transparent dielectric film region. In the present embodiments, the coating preferably has a metal/dielectric ratio of at least 0.25. The metal/dielectric ratio is defined as the combined thickness of the first, second, and third infrared-reflection film regions divided by the combined thickness of the first, second, third, and fourth transparent dielectric film regions. Preferably, the transparent substrate is part of a multiple-pane insulating glazing unit that includes a second pane, the unit has at least one between-pane space, and the desired major surface is exposed to a between-pane space of the unit. In the present embodiments, the insulating glazing unit preferably has a visible transmittance of 0.65 or more.

In certain embodiments, the invention provides a glass pane having two generally opposed major surfaces with a multiple cavity low-emissivity coating on a desired one of the major surfaces. The coating comprises, in sequence from the desired major surface outward, a first transparent dielectric film region, a first layer comprising silver, a second transparent dielectric film region, a second layer comprising silver, a third transparent dielectric film region, a third layer comprising silver, and a fourth transparent dielectric film region. In the present embodiments, the coating has a metal/dielectric ratio of at least 0.22. The metal/dielectric ratio is defined as the combined thickness of the first, second, and third layers comprising silver divided by the combined thickness of the first, second, third, and fourth transparent dielectric film regions. Preferably, the glass pane is part of a multiple-pane insulating glass unit that includes a second glass pane, the unit has at least one between-pane space, and the desired major surface is exposed to a between-pane space of the unit. In the present embodiments, the insulating glass unit preferably has an exterior reflected color characterized by a chroma magnitude number of less than about 1.82. In some of the present embodiments, the metal/dielectric ratio is at least 0.25. Optionally, the first, second, and third layers comprising silver each have a thickness of between about 75 angstroms and about 275 angstroms. Additionally or alternatively, the first, second, third, and fourth transparent dielectric film regions can optionally each have a total physical thickness of between about 100 angstroms and about 800 angstroms. In some cases, the first, second, and third layers comprising silver each have a thickness of between about 100 angstroms and about 250 angstroms. Additionally or alternatively, the first, second, third, and fourth transparent dielectric film regions can optionally each have a total physical thickness of between about 50 angstroms and about 900 angstroms. In some of the present embodiments, the coating has only two cavities including a first cavity between the first and second layers comprising silver and a second cavity between the second and third layers comprising silver, with each of these two cavities optionally having a thickness of between about 300 angstroms and about 850 angstroms, or perhaps between about 400 angstroms and about 750 angstroms.

DETAILED DESCRIPTION OF PREFERRED EMBODIMENTS

Figure 1:
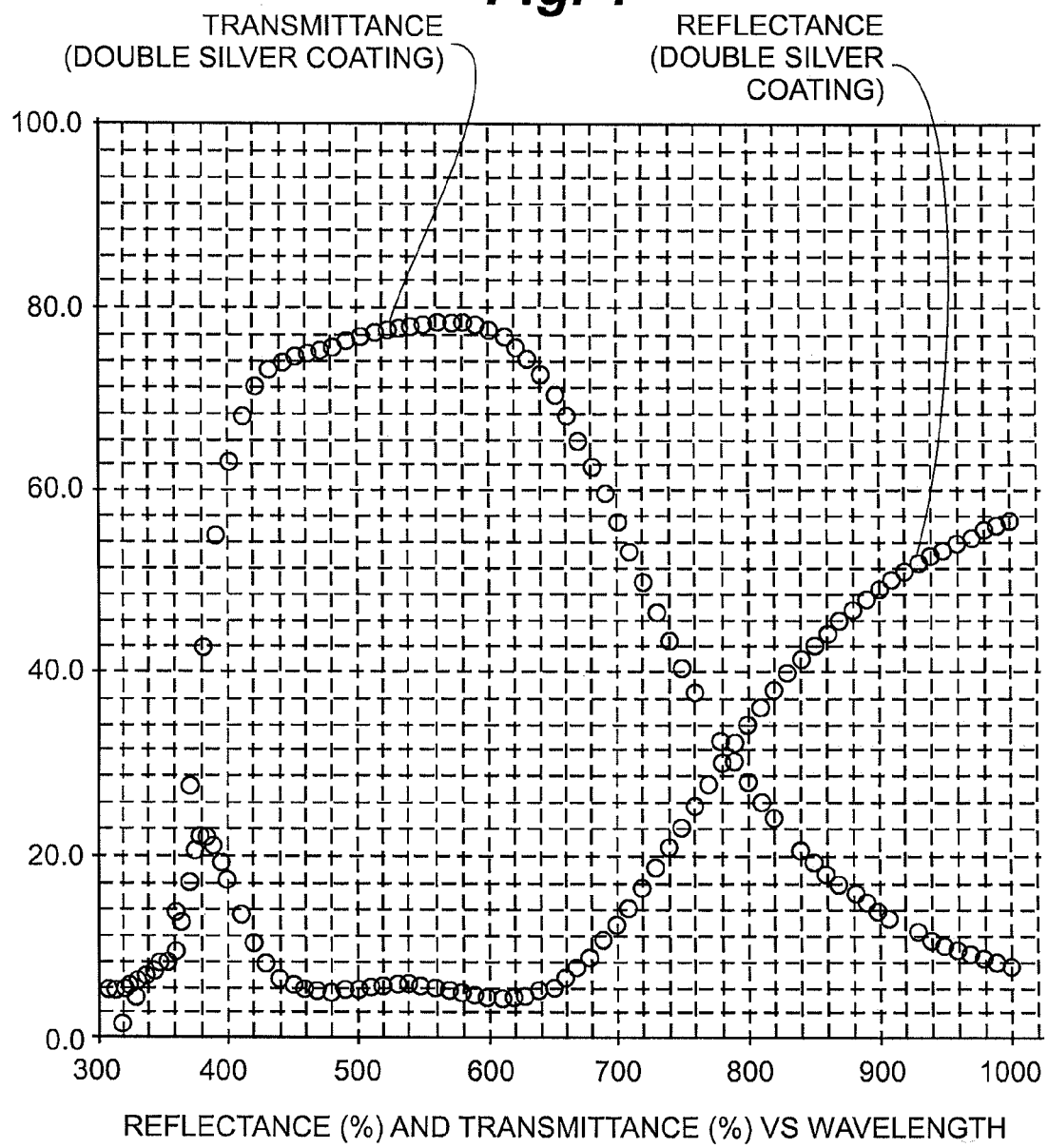
FIG. 1 is a graph showing the spectral properties of a commercially available double silver low-emissivity coating.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Single and double silver low-emissivity coatings have been known in the art for years. Single silver low-emissivity coatings provide advantageous infrared reflection, commonly in the neighborhood of 97%. Double silver low-emissivity coatings offer further improvements in terms of high visible transmission and high infrared reflection. There are, however, practical ceilings on the infrared reflection levels that can be achieved using a double silver low-emissivity coating. For example, while increasing the amount of silver in a double silver coating may boost the infrared reflection above 97%, the road toward even higher infrared reflection, e.g., above 98.5%, is difficult to achieve in a double silver coating having a good balance of other properties (high visible transmission, good color, durability, etc.).

FIG. 1 is a graph showing the spectral properties of a highly advantageous commercially available double silver low-emissivity coating. This graph shows transmission (the curve that is upwardly convex in the visible wavelength range) and glass-side reflection (the curve that is downwardly concave in the visible wavelength range) for a glass sheet bearing the double silver low-emissivity coating. While this particular double silver coating offers excellent spectral properties, it has been reported that conventional double silver coatings allow anywhere from 5% to 50% transmission in the infrared wavelength range (U.S. Pat. No. 6,262,830, column 6, lines 43-51).

Figure 2:
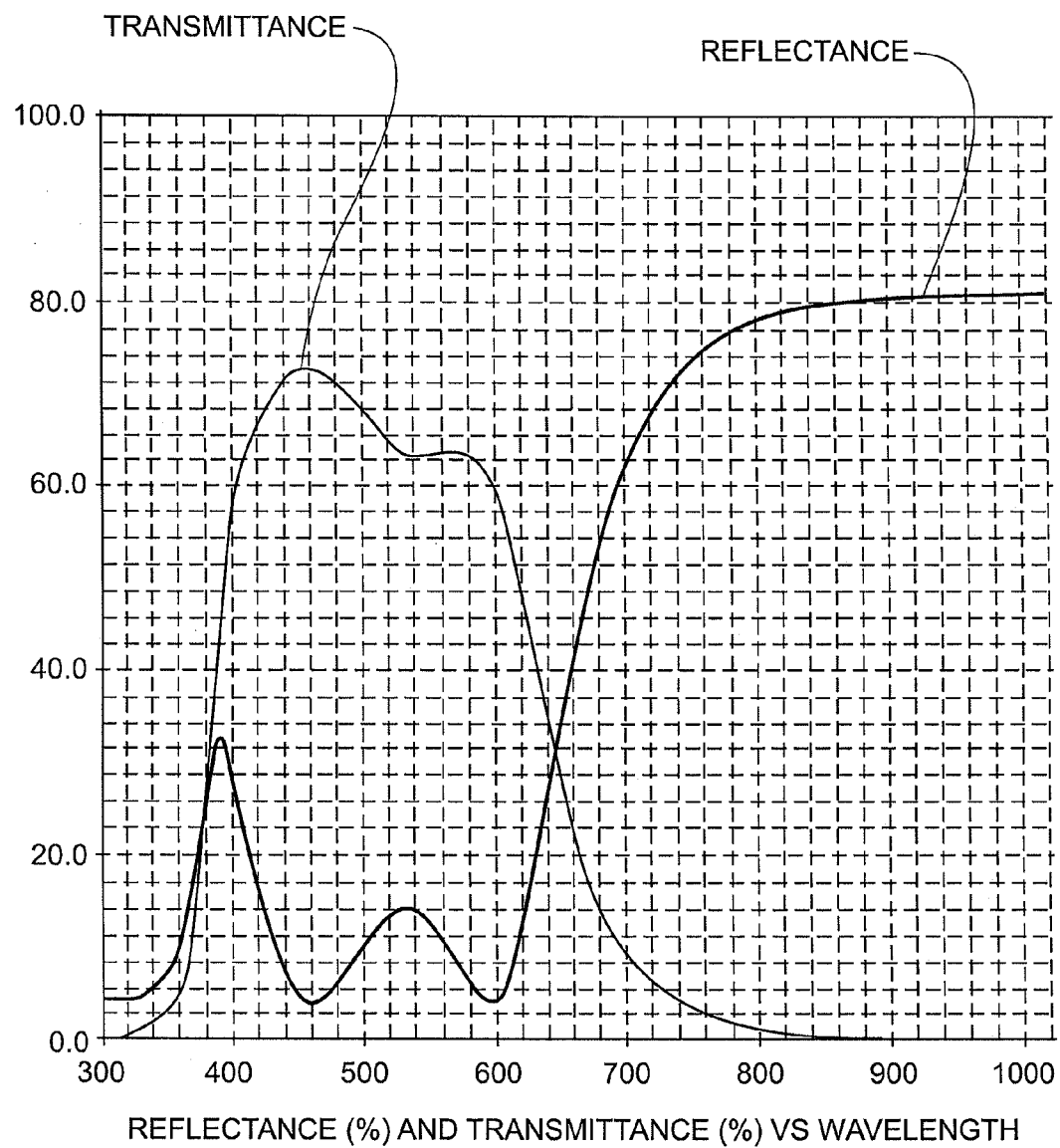
FIG. 2 is a graph showing the spectral properties of a high infrared reflection coating in accordance with certain embodiments of the present invention.

FIG. 2 is a graph showing the spectral properties of a high infrared reflection coating in accordance with certain embodiments of the present invention. Here again, the graph shows transmission (the curve that is upwardly convex in the visible wavelength range) and glass-side reflection (the curve that is downwardly concave in the visible wavelength range) for a glass sheet bearing the high infrared reflection coating.

Figure 3:
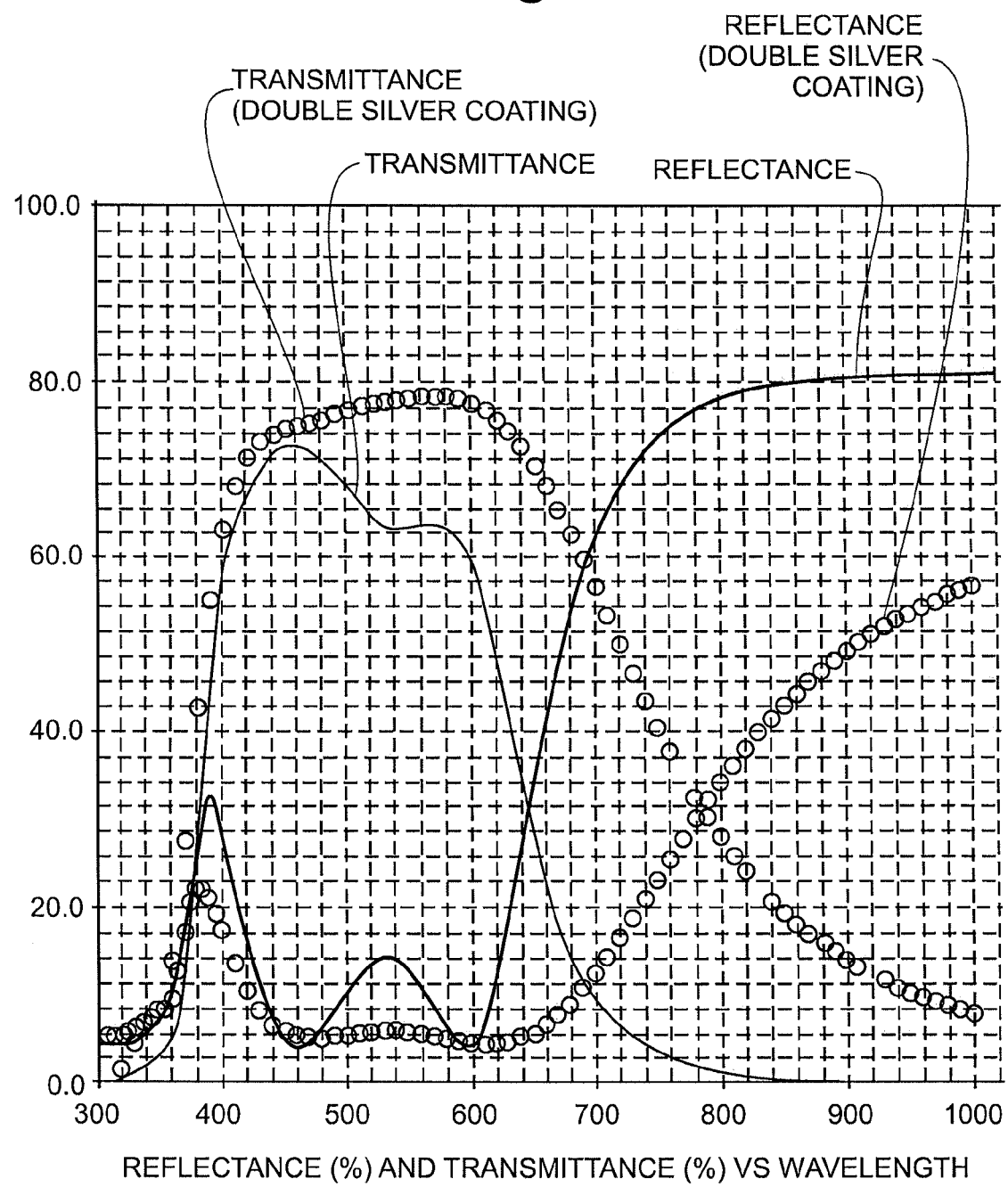
FIG. 3 is a graph comparing the spectral properties of a high infrared reflection coating in accordance with certain embodiments of the invention against a commercially available double silver low-emissivity coating.

The infrared reflection for the present coating 7 is much higher than that of the double silver coating. This is perhaps best appreciated by referring to FIG. 3, which is a graph showing both the spectral properties of the high infrared reflection coating 7 and those of the double silver coating. Here, a side-by-side comparison can be made of the infrared reflection levels achieved by these two coatings. It can be seen that the present coating 7 achieves a much higher infrared reflection than the double silver coating. It can also be seen that the levels of visible transmission for these two coatings are comparable. Moreover, the cutoff between visible wavelengths and infrared wavelengths is much sharper for the present coating 7 (the curves delineated with solid lines) than for the double silver coating (the curves delineated with circles). Thus, the high infrared reflection coating 7 provides a quantum leap forward in terms of energy efficiency compared to double silver low-emissivity coatings, and even more so compared to single silver low-emissivity coatings.

The present high infrared reflection coating (or "multiple cavity low-emissivity coating") 7 has a number of beneficial properties. The ensuing discussion reports several of these properties. In some cases, properties are reported herein for a single (i.e., monolithic) pane 12 bearing the present coating 7 on one surface 18. In other cases, these properties are reported for an IG unit 3 having the present coating 7 on its #2 surface 18. In such cases, the reported properties are for an IG unit wherein both panes are clear 2.2 mm soda lime float glass with a ½ inch between-pane space filled with an insulative gas mix of 90% argon and 10% air. Of course, these specifics are by no means limiting to the invention. Absent an express statement to the contrary, the present discussion reports determinations made using the well known WINDOW 5.2a computer program (e.g., calculating center of glass data) under standard ASHRAE conditions.

As noted above, the high infrared reflection coating 7 provides exceptional thermal insulating properties. The coating 7 comprises three infrared-reflection film regions 100, 200, and 300. These film regions are typically silver or another electrically conductive material, and they impart exceptionally low sheet resistance in the coating. For example, the sheet resistance of the present coating 7 is less than 3.0 $\Omega$/square. Preferably, the sheet resistance of this coating 7 is less than 2.5 $\Omega$/square (e.g., less than 2.0

Ω/square, less than 1.75 Ω/square, less than 1.5 Ω/square, or even less than 1.35 Ω/square). While the desired level of sheet resistance can be selected and varied to accommodate different applications, a number of preferred coating embodiments (e.g., the exemplary film stacks tabulated below) provide a sheet resistance of less than 1.4 Ω/square, such as about 1.25-1.3 Ω/square. The sheet resistance of the coating can be measured in standard fashion using a 4-point probe. Other methods known in the art as being useful for calculating sheet resistance can also be used.

The coating 7 also has exceptionally low emissivity. For example, the emissivity of the coating 7 is less than 0.06. Preferably, the emissivity of this coating 7 is less than 0.04 (e.g., less than 0.03, or even less than 0.025). While the desired level of emissivity can be selected and varied to accommodate different applications, a number of preferred coating embodiments (e.g., the exemplary film stacks tabulated below) provide an emissivity of less than 0.023, less than 0.022, or even less than 0.021. In one embodiment, the emissivity is about 0.020. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: E=1−Reflectance. The present emissivity values can be determined as specified in "Standard Test Method For Emittance Of Specular Surfaces Using Spectrometric Measurements" NFRC 301-93, the entire teachings of which are incorporated herein by reference. Emissivity can be calculated by multiplying the measured sheet resistance by 0.016866. Using this method, a coating 7 that provides sheet resistance of about 1.25 can be found to have an emissivity of about 0.021.

In addition to low sheet resistance and low emissivity, the present coating 7 provides exceptional solar heat gain properties. As is well known, the solar heat gain coefficient (SHGC) of a window is the fraction of incident solar radiation that is admitted through a window. There are a number of applications where low solar heat gain windows are of particular benefit. In warm climates, for example, it is especially desirable to have low solar heat gain windows. For example, solar heat gain coefficients of about 0.4 and below are generally recommended for buildings in the southern United States. Further, windows that are exposed to a lot of undesirable sun benefit from having a low solar heat gain coefficient. Windows on the east or west side of a building, for instance, tend to get a lot of sun in the morning and afternoon. For applications like these, the solar heat gain coefficient plays a vital role in maintaining a comfortable environment within the building. Thus, it is particularly beneficial to provide windows of this nature with coatings that establish a low solar heat gain coefficient (i.e., low solar heat gain coatings). Low solar heat gain coatings would, in fact, be highly desirable for many window applications. However, these coatings have not traditionally offered high enough visible transmission to be more broadly adopted.

A tradeoff is sometimes made in low solar heat gain coatings whereby the films selected to achieve a low SHGC have the effect of decreasing the visible transmittance to a lower level than is ideal and/or increasing the visible reflectance to a higher level than is ideal. As a consequence, windows bearing these coatings may have unacceptably low visible transmission and/or a somewhat mirror-like appearance.

The present coating 7 provides an exceptionally low solar heat gain coefficient. For example, the solar heat gain coefficient of the present IG unit 3 is less than 0.4. Preferably, the present IG unit 3 has a solar heat gain coefficient of less than 0.35 (e.g., less than 0.33, or less than 0.31), less than 0.29, or even less than 0.28 (such as 0.27 or less). While the desired SHGC level can be selected and varied to accommodate different applications, some preferred embodiments (e.g., where the coating 7 is one of the exemplary film stacks tabulated below) provide an IG unit 3 having a solar heat gain coefficient of between 0.25 and 0.29 (e.g., between 0.25 and 0.28, such as 0.27). The present coating 7 can provide a SHGC within any one or more of these ranges while at the same time providing exceptional color (e.g., any color range noted below) and/or high visible transmission (e.g., any visible transmission range noted below). In some cases, the coating 7 provides this balance of properties while having a surprisingly high metal/dielectric ratio, as described below.

The term "solar heat gain coefficient" is used herein in accordance with its well known meaning. Reference is made to NFRC 200-93 (1993), the entire teachings of which are incorporated herein by reference. The SHGC can be calculated using the methodology embedded in the well known WINDOW 5.2a computer program.

In combination with the beneficial thermal insulating properties discussed above, the present coating 7 has exceptional optical properties. As noted above, a tradeoff is sometimes made in low solar heat gain coatings whereby the films selected to achieve good thermal insulating properties have the effect of restricting the visible transmission to a level that is lower than ideal.

To the contrary, the present coating 7 provides an exceptional combination of total visible transmission and thermal insulating properties. For example, the present IG unit 3 (and the present pane 12, whether monolithic or as part of the IG unit 3) has a visible transmittance $T_v$ of greater than 0.45 (i.e., greater than 45%). Preferably, the present IG unit 3 (and the present pane 12, whether monolithic or insulated) achieves a visible transmittance $T_v$ of greater than 0.55 (e.g., greater than 0.6), greater than 0.63, or even greater than 0.64. While the desired level of visible transmittance can be selected and varied to accommodate different applications, certain preferred embodiments (e.g., where the coating 7 is one of the exemplary film stacks tabulated below) provide an IG unit 3 (or a pane 12, which can be monolithic or part of the IG unit 3) having a visible transmittance of greater than 0.65, such as about 0.66

In one particular group of embodiments, the film region thicknesses and compositions are selected to achieve a visible transmittance of greater than 0.7, greater than 0.71, or even greater than 0.072. In some cases, the film region thicknesses and compositions are selected to achieve a visible transmittance of about 0.73. Here, the infrared-reflection film regions can optionally be thinned to provide the desired transmittance. Additionally or alternatively, the coating 7 can be provided with blocker layers that are each dielectric films (such as oxide, nitride, and/or oxynitride films) throughout their thickness (rather than having an innermost metal portion). Here, the coating 7 can provide a visible transmittance within any one or more of the ranges noted in this paragraph (or the previous paragraph) in combination with having a minimum combined thickness for the three infrared-reflective film regions within any one or more of the ranges described below and/or in combination with any one or more of the minimums noted below for the metal/dielectric ratio.

The term "visible transmittance" is well known in the art and is used herein in accordance with its well-known meaning. Visible transmittance, as well as visible reflectance, can be determined in accordance with NFRC 300, Standard Test Method for Determining the Solar and Infrared Optical Properties of Glazing Materials and Fading Resistance of Systems (National Fenestration Rating Council Incorporated, adopted December 2001, published January 2002). The well known WINDOW 5.2a computer program can be used in calculating these and other reported optical properties.

Preferably, the coated substrate (i.e., the present pane) 12 has a spectral transmission curve with a peak transmission located in the visible wavelength range. This is readily apparent in FIG. 2. In certain embodiments, this spectral transmission curve has a halfwidth of less than 360 nm, less than 320 nm, less than 310 nm, less than 305 nm, less than 300 nm, less than 290 nm, less than 280 nm, less than 275 nm, less than 265 nm, or even less than 250 nm. In these embodiments, the coating 7 provides a highly advantageous narrow transmission curve, which desirably has high visible transmittance spanning the visible range and, at the same time, provides an exceptionally steep slope between highly transmitted visible wavelengths and highly reflected infrared wavelengths. In certain embodiments, the coating 7 additionally (i.e., together with having any maximum halfwidth noted above) or alternatively achieves a halfwidth that is greater than 50 nm, greater than 100 nm, greater than 150 nm, or even greater than 175 nm. This can be desirable in providing high levels of visible transmittance over a substantial portion of the visible spectrum.

The present coating 7 provides exceptional efficiency in terms of the low solar heat gain coefficient that is achieved in combination with high visible transmission. The ratio of visible transmittance (as a fraction of unity) over SHGC is referred to herein as the visible-thermal efficiency ratio of the present IG unit 3. This ratio preferably is greater than 2, greater than 2.2, or even greater than 2.3. In some preferred embodiments, this ratio is greater than 2.33, greater than 2.34, greater than 2.37, greater than 2.4, greater than 2.42, or even greater than 2.43. In some embodiments, this ratio is about 2.37. In other embodiments, this ratio is about 2.44. Certain preferred embodiments (e.g., where the coating 7 is one of the exemplary film stacks tabulated below) provide an IG unit 3 having a visible-thermal efficiency ratio of greater than 2.0 but less than 2.5 (e.g., about 2.4-2.5), such as about 2.44.

Another useful parameter to consider is $T_{740}$, i.e., the transmittance at 740 nm. The present coating 7 can provide a particularly low $T_{740}$, while at the same time providing high levels of visible transmittance and good color properties. For example, the present pane 12 preferably has a $T_{740}$ of less than 0.30, or even less than 0.20. Perhaps more preferably, the present pane 12 (when monolithic, or when part of an insulating unit) has a $T_{740}$ of less than 0.15 (e.g., less than 0.1, less than 0.07, less than 0.06, or even less than 0.05). While the desired level of transmittance at 740 nm can be selected and varied to accommodate different applications, certain preferred embodiments (e.g., where the coating 7 is one of the exemplary film stacks tabulated below) provide a coated pane 12 (which can be monolithic or part of the IG unit 3) having a $T_{740}$ of about 0.04.

The present coating 7 can achieve color properties that are exceptional, particularly given the high level of thermal insulation it facilitates. The coating 7 is extremely well suited for applications in which reflected color is of concern. The following discussion of color is reported using the well known color coordinates of "a" and "b". In particular, these color coordinates are indicated herein using the subscript h (i.e., $a_h$ and $b_h$) to represent the conventional use of the well known Hunter Lab Color System (Hunter methods/units, Ill. D65, 10 degree observer). The present color properties can be determined as specified in ASTM Method E 308, the entire teachings of which are incorporated herein by reference.

The present IG unit has an exceptionally neutral (i.e., colorless) appearance in reflection, with any appreciable color being of a pleasing hue. The reflected color reported herein is as viewed from the exterior of the present IG unit (i.e., off the #1 surface side of the outboard pane). In some embodiments, the present IG unit exhibits a reflected color characterized by an $a_h$ color coordinate of between about +1.5 and about −2 and a $b_h$ color coordinate of between about 0 and about −3. These embodiments represent a broader embodiment group wherein (whether or not the $a_h$ and $b_h$ are within the ranges noted above) the present IG unit has an exterior reflected color characterized by a chroma magnitude number (defined as the square root of $[a_h^2+b_h^2]$) of less than about 3.6. It is a commonly stated goal for coatings to achieve a color neutral appearance. With coatings having three or more infrared-reflection film regions, however, this becomes a more difficult pursuit, and the difficulty tends to increase with greater total metal thickness. Moreover, the color properties achieved by the present coatings are particularly surprising given the metal/dielectric ratios used in certain embodiments disclosed herein.

Preferably, the magnitude of at least one of the $a_h$ and $b_h$ coordinates is negative (in some embodiments, both are negative). In certain embodiments, at least one these color coordinates (e.g., $b_h$) is significantly away (e.g., by at least 0.25, at least 0.3, or at least 0.5 in magnitude) from the vertical and/or horizontal axes of the color space (i.e., away from the "zero" coordinates). As one approaches the vertical and/or horizontal axes of the color space, a small change in the magnitude of $a_h$ or $b_h$ may translate into a considerable change in terms of actual appearance, the less desirable yellow or red zones being thereby encroached.

The present coating 7 can achieve a reflected color that is exceptional in actual appearance. In certain preferred embodiments (e.g., where the coating 7 is one of the exemplary film stacks tabulated or detailed below), the IG unit exhibits a reflected color characterized by an $a_h$ color coordinate of between about +1 and about −1 (e.g., between about 0 and about −0.5) and a $b_h$ color coordinate of between about −0.5 and about −2.5 (e.g., between about −1.5 and about −1.75). These embodiments represent a broader group of embodiments wherein (whether or not $a_h$ and $b_h$ are within the noted ranges) the present IG unit has an exterior reflected color characterized by a chroma magnitude number of less than about 2.7, such as less than about 1.82. The desirability of these color properties on a qualitative level (in terms of the appearance of a window bearing this coating) is best appreciated by viewing an IG unit bearing the present coating 7 in comparison to IG units bearing other coatings that have comparable total amounts of infrared-reflection film.

The present IG unit also exhibits a pleasing transmitted color. Preferably, the IG unit exhibits a transmitted color characterized by an $a_h$ color coordinate of between about −3.5 and about −6 and a $b_h$ color coordinate of between about +2.25 and about +4.5. In certain preferred embodiments (e.g., where the coating is one of the preferred film stacks tabulated or detailed below), the IG unit exhibits a transmitted color characterized by an $a_h$ color coordinate of between about −4 and about −5.5 (e.g., between about −4.5 and about −5) and a $b_h$ color coordinate of between about +2.5 and about +4.25 (e.g., between about +3 and about +3.5). These embodiments represent a broader embodiment group wherein the magnitude of at least one of the $a_h$ and $b_h$ coordinates is negative for transmitted color.

Figure 4:
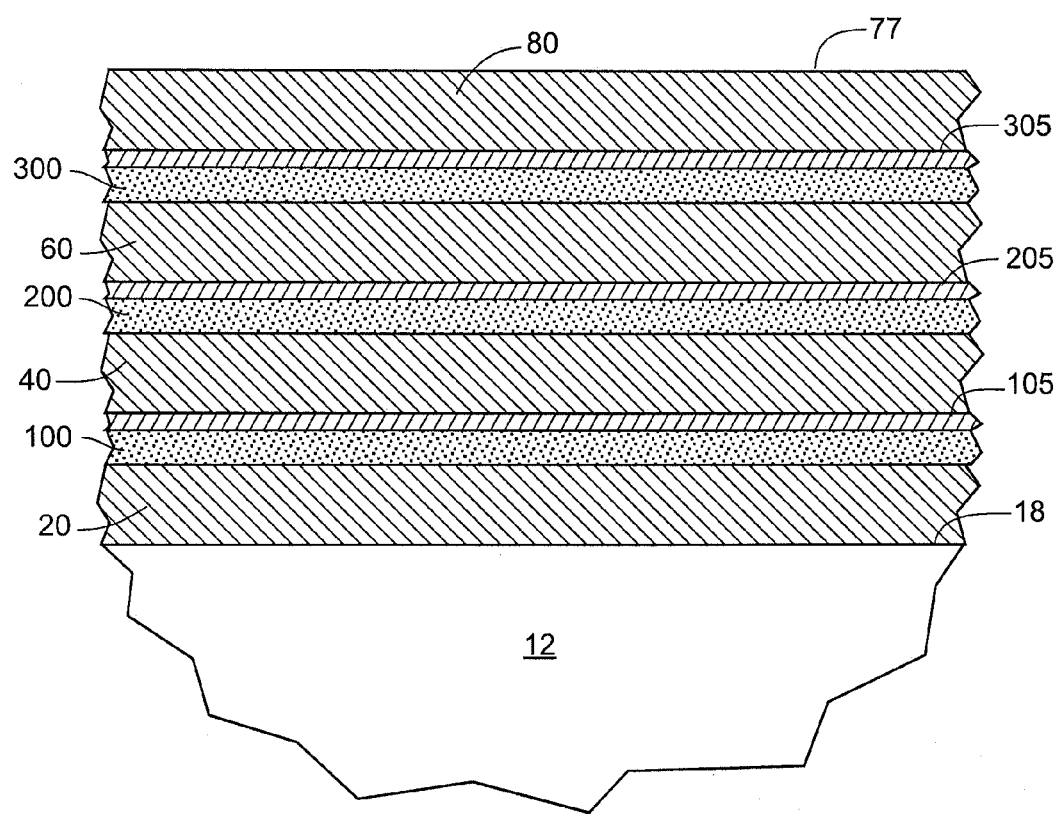
FIG. 4 is a schematic cross-sectional side view of a substrate bearing a high infrared reflection coating in accordance with certain embodiments of the invention.

FIG. 4 exemplifies certain embodiments that provide a coated substrate 12 having a major surface 18 bearing a multiple cavity, low-emissivity coating 7. The coating includes, in sequence from the major surface 18 outward, a first transparent dielectric film region 20, a first infrared-reflection film region 100, a second transparent dielectric film region 40, a second infrared-reflection film region 200, a third transparent dielectric film region 60, a third infrared-reflection film region 300, and a fourth transparent dielectric film region 80. In FIG. 4, optional blocker film regions 105, 205, 305 are shown, although these are not required in all embodiments.

Thus, the present coating includes at least two cavities. For purposes of the present disclosure, the term "cavity" is defined to mean the space between two adjacent infrared-reflection film regions. In some of the present embodiments, the coating has only two cavities. In other embodiments, the coating has three or more cavities. In some of the both embodiment types, each of the cavities has a thickness of between about 300 Å and about 850 Å, and perhaps more preferably between about 400 Å and about 750 Å.

Some embodiments of the invention provide a metal/dielectric ratio that has surprisingly been found to give exceptional results. Here, the "metal/dielectric ratio" is the total thickness of all the infrared-reflection film regions (in embodiments involving silver, the total silver thickness) divided by the total thickness of the transparent dielectric film regions (not counting any blocker layers that may be present). In the present embodiments, the metal/dielectric ratio preferably is at least 0.2, at least 0.22, at least 0.25, at least 0.26, or even at least 0.27. Tabulated below are exemplary embodiments wherein this ratio is between about 0.27 and about 0.28.

Each infrared-reflection film region 100, 200, 300 can advantageously comprise (optionally at least 50 atomic percent of, in some cases consisting essentially of) silver. Further, in some embodiments, the thickness of at least one of the infrared-reflection film regions 100, 200, 300 is greater than 150 angstroms, greater than 175 angstroms, or even greater than 200 angstroms. Additionally or alternatively, the first, second, and third infrared-reflection film regions can optionally have a combined thickness of greater than 425 Å, greater than 450 Å, greater than 460 Å, greater than 470 Å, greater than 475 Å, or even greater than 485 Å. In one embodiment, this combined thicknesses is about 477 Å. For example, in some cases, the first, second, and third infrared-reflection film regions 100, 200, 300 are silver layers having respective thicknesses of 122 Å, 149 Å, and 206 Å. In another embodiment, the combined thicknesses is about 492 Å. For example, in some cases, the first, second, and third infrared-reflection film regions 100, 200, 300 are silver layers having respective thicknesses of 128 Å, 157 Å, and 207 Å.

Certain embodiments provide the second and third infrared-reflection film regions (each of which can optionally be a layer, such as a discrete layer of silver) at a combined thickness of at least 325 Å, at least 335 Å, at least 340 Å, at least 350 Å, or even at least 355 Å. In some embodiments, this combined thickness is 355-395 Å. Here, a relatively large amount of reflective film (e.g., silver) is concentrated at the outer portions of the coating, with the goal of this having a particularly great lowering of emissivity while at the same time facilitating particularly good color, visible transmission, and visible reflection properties. Additionally or alternatively, at least one of the infrared-reflection film regions can be thicker than at least one of the other infrared-reflection film regions by at least 50 Å, at least 75 Å, or at least 80 Å. In some preferred embodiments of this nature, it is the third infrared-reflection film region that is thicker than the first infrared-reflection film region, by one or more of the noted amounts.

Some embodiments provide an arrangement wherein the second infrared-reflection film region is thicker than the first infrared-reflection film region by at least 10 Å, at least 20 Å, at least 25 Å, or even at least 30 Å. Additionally or alternatively, the third infrared-reflection film region can be thicker than the second infrared-reflection film region by at least 25 Å, at least 35 Å, at least 40 Å, or even at least 50 Å.

One group of embodiments provides a coated substrate (e.g., a coated pane, such as a glass pane, optionally having a major dimension of at least 1 meter, or at least 1.2 meters) bearing a low-emissivity coating 7 that comprises three infrared-reflection film regions 100, 200, 300 having a combined thickness of between 420 Å and 575 Å, optionally in combination with a metal/dielectric ratio within one or more of the ranges described above.

The infrared-reflection film regions 100, 200, 300 are described below in further detail. Briefly, though, some preferred embodiments provide these film regions in the form of silver layers each comprising (optionally consisting essentially of) silver, with these three layers optionally being the only silver-containing layers in the coating. These three silver-containing layers can optionally each have a thickness of between about 50 Å and about 300 Å. Preferably, though, they each have a thickness of between about 75 Å and about 275 Å, and perhaps more preferably between about 100 Å and about 250 Å. In one embodiment of this nature, the substrate 12 is a glass sheet having a major dimension of at least one meter (or at least 1.2 meters), and this glass sheet is part of a multiple-pane insulating glass unit that includes at least one other glass sheet, where the multiple-pane unit has a between-pane space 1500, which can optionally be evacuated, filled with air, or filled with air and insulative gas (e.g., argon).

With respect to the four transparent dielectric film regions 20, 40, 60, 80, in certain embodiments, each of these film regions has a total physical thickness of between about 50 Å and about 900 Å, and perhaps more preferably between about 100 Å and about 800 Å. These dielectric film regions are described below in more detail.

The first transparent dielectric film region 20 is applied over (in some cases, directly over) a major surface 18 of the substrate 12. This film region 20 can be of any composition that includes at least some (or, optionally, consists essentially of) transparent dielectric film. In some cases, the first transparent dielectric film region 20 is a single layer. In other cases, it comprises a plurality of layers. As described in U.S. Pat. No. 5,296,302 (the teachings of which concerning useful dielectric materials are incorporated herein by reference), useful dielectric film materials for this purpose include oxides of zinc, tin, indium, bismuth, titanium, hafnium, zirconium, and alloys thereof. Film comprising silicon nitride and/or silicon oxynitride is also used in some embodiments. The film region 20 can optionally include one or more absorbing dielectric and/or metal films, such as to control shading, color, or other optical properties.

The first transparent dielectric film region 20 can be a single layer of a single dielectric material. If a single layer is used, it is generally preferred that this inner dielectric layer be formed of a mixture of zinc oxide and tin oxide (referred to below, e.g., in Table 1, as "Zn+O"). It should be understood, though, that such a single layer can be replaced with two or more layers of different dielectric materials. In certain embodiments, the first transparent dielectric film region 20 comprises a graded thickness of film, having a composition that changes (e.g., in a gradual manner) with increasing distance from the substrate 12.

In some particular embodiments, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In some cases, this desired total thickness is less than 195 angstroms, less than 190 angstroms, less than 175 angstroms, less than 165 angstroms, less than 145 angstroms, or even less than 140 angstroms.

Referring again to FIG. 4, the first infrared-reflection film region is identified by the reference number 100. This film region 100 preferably is contiguous to, i.e., in direct physical contact with, the outer face of the first transparent dielectric film region 20. Any suitable infrared reflection material can be used. Silver, gold, and copper, as well as alloys thereof, are the most commonly used infrared-reflection film materials. Preferably, the infrared-reflection film consists essentially of silver or silver combined with no more than about 5% of another metal, such as another metal selected from the group consisting of gold, platinum, and palladium. This, however, is by no means required.

When desired for protection of the infrared-reflection film during application of subsequent film and/or during any heat treatment (e.g., tempering), a first blocker film region 105 can optionally be provided over and contiguous to the first infrared-reflection film region 100. This blocker film region 105 can be provided to protect the underlying infrared-reflection film region 100 from chemical attack. In such cases, any material that is readily oxidized may be useful. In certain embodiments, a thin layer of titanium metal is applied, and in some cases (e.g., cases where oxide film is reactively deposited directly over such a blocker film region) at least an outermost thickness of that titanium metal is converted to titanium oxide of varying stoichiometry during deposition of overlying film. In another embodiment, the blocker film region 105 is deposited as a layer of niobium. Useful blocker layers comprising niobium are discussed in detail in PCT International Publication No. WO 97/48649. The teachings of this PCT Publication relating to blocker layers are incorporated herein by reference. In other embodiments, the blocker film region 105 can comprise a material selected from the group consisting of nickel, chromium, zinc, tin, aluminum, indium, and zirconium.

In some embodiments, a high transmission blocker layer material (e.g., a dielectric material) is used for one or more (optionally for each of the) blocker film regions 105, 205, 305. The material used, for example, can be an oxide, nitride, or oxynitride. This material can advantageously be sputtered from a ceramic target either in an inert atmosphere, a nitriding atmosphere, or a slightly oxidizing atmosphere. In some embodiments, a substoichiometric sputterable target material is used. For example, the target material can optionally comprise substoichiometric titania, $TiO_x$, where x is less than 2. Alternatively, a ZnAlO target may be used. In still other embodiments, a ceramic target comprising titanium, silicon, and oxygen is used. If so desired, a very thin metal film (e.g., less than 25 Å, less than 20 Å, less than 15 Å, less than 10 Å, less than 9 Å, or even less than 8 Å) can be applied directly over the infrared-reflection film, and directly over this thin metal film there can be applied a dielectric blocker film region (which optionally has a thickness of less than 50 Å, less than 40 Å, less than 30 Å, less than 25 Å, less than 20 Å, or even less than 15 Å). When provided, the very thin metal film can, for example, be deposited as a metallic film comprising titanium, niobium, nickel, chromium, nickel-chrome, zinc, tin, zinc-tin, aluminum, indium, zirconium, or a combination including at least one of these materials together with one or more other metallic materials. In these embodiments, the thin metal film desirably is deposited in an inert atmosphere and the dielectric blocker film region can be deposited either in an inert or reactive atmosphere. For example, when sputtering is used, a ceramic target can be sputtered in an inert or slightly reactive atmosphere, or a metal target can be sputtered in a reactive atmosphere.

In one particular group of embodiments, the coating 7 comprises three infrared-reflection film regions directly over at least one of which (and optionally over each of which) there is provided a blocker film region that is deposited in a non-metallic form (e.g., as a non-metallic material selected from the group consisting of an oxide, a nitride, and an oxynitride, including substoichiometric forms thereof). In this group of embodiments, the thickness for each such blocker film region can be within any one of the ranges noted herein for the optional blocker film regions, such as less than 50 Å. For example, exemplary thicknesses for the optional blocker film region generally range from 3-35 Å, or 3-25 Å, such as 3-18 Å.

In certain embodiments, the first blocker film region 105 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the first infrared-reflection film region 100 as well.

The second transparent dielectric film region 40 is positioned between the first infrared-reflection film region 100 and the second infrared-reflection film region 200 (the area between these two film regions 100, 200 being referred to herein as the "first cavity"). The film region 40 can be referred to as a first "spacer" film region, which is located in the first cavity. This first spacer film region 40 can be a single layer of a single transparent dielectric material, or it can be a plurality of layers of different transparent dielectric materials. In some cases, the second transparent dielectric film region 40 comprises at least three transparent dielectric layers. Optionally, there are at least five, or even at least seven, such layers. As an alternative to using one or more discrete layers, part or all of the second transparent dielectric film region 40 can have a graded composition (optionally characterized by a gradual transition from one transparent dielectric material to another with increasing distance from the substrate). The film region 40 can optionally include one or more absorbing dielectric and/or metal films, such as to control shading, color, or other optical properties.

The next illustrated film region is the second infrared-reflection film region 200. This film region 200 preferably is contiguous to the outer face of the second transparent dielectric film region 40. Any suitable infrared reflection material can be used, such as silver, gold, and copper, or alloys including one or more of these metals. In some particular embodiments, the infrared-reflection film consists essentially of silver or silver combined with no more than about 5% of another metal, such as another metal selected from the group consisting of gold, platinum, and palladium.

When desired for protection of the second infrared-reflection film region 200, a second blocker film region 205 can optionally be provided over and contiguous to the second infrared-reflection film region 200. This blocker film region 205, for example, can comprise any material that is readily oxidized. In certain embodiments, a thin layer of titanium metal is applied, and in some cases (e.g., cases where oxide film is reactively deposited directly over this blocker film region 205) at least an outermost thickness of that titanium metal is converted to a titanium oxide of varying stoichiometry during deposition of overlying film. In other cases, the blocker film region 205 can comprise a material selected from the group consisting of nickel, chromium, zinc, tin, aluminum, indium, and zirconium. In another embodiment, the blocker film region 205 is deposited as a layer of niobium or one of the non-metallic blocker film materials discussed above. The blocker film region 205, for example, can optionally comprise the above-noted arrangement of: a very thin metal film directly over film region 200, and; a dielectric film directly over this very thin metal film. Alternatively, the dielectric film can be deposited directly over film region 200.

Suitable thicknesses for the optional second blocker film region 205 generally range from 3-35 Å, 3-25 Å, or 3-18 Å. In certain embodiments, the second blocker film region 205 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the second infrared-reflection film region 200.

The third transparent dielectric film region 60 is positioned between the second infrared-reflection film region 200 and the third infrared-reflection film region 300. This transparent dielectric film region 60 is also a spacer film region (it is located within the "second cavity"), and can be referred to as the second spacer film region. The third transparent dielectric film region 60 can be a single layer of a single transparent dielectric material, or it can be a plurality of layers of different transparent dielectric materials. In some cases, the third transparent dielectric film region 60 comprises at least three transparent dielectric layers. Optionally, there are at least five, or even at least seven, such layers. As an alternative to one or more discrete layers, part or all of the third transparent dielectric film region 60 can have a graded composition. The film region 60 can optionally include one or more absorbing dielectric and/or metal films, such as to control shading, color, or other optical properties.

The next illustrated film region is the third infrared-reflection film region 300. This film region 300 preferably is contiguous to the outer face of the third transparent dielectric film region 60. Any suitable infrared reflection material can be used (e.g., silver, gold, copper, or an alloy comprising one or more of these metals). In some particular embodiments, the third infrared-reflection film region 300 consists essentially of silver or silver combined with no more than about 5% of another metal, such as another metal selected from the group consisting of gold, platinum, and palladium.

When desired for protection of the third infrared-reflection film region 300, a third blocker film region 305 can optionally be provided over and contiguous to the third infrared-reflection film region 300. This blocker film region 305, for example, can comprise any material that is readily oxidized. In certain embodiments, a thin layer of titanium metal is applied, and in some cases (e.g., cases where oxide film is reactively deposited directly over this blocker film region 305) at least an outermost thickness of that titanium metal is converted to a titanium oxide of varying stoichiometry during deposition of overlying film. In other cases, the blocker film region 305 can comprise a material selected from the group consisting of nickel, chromium, zinc, tin, aluminum, indium, and zirconium. In another embodiment, the blocker film region 305 is deposited as a layer of niobium or one of the non-metallic blocker film materials described above. The blocker film region 305, for example, can optionally comprise the above-noted arrangement of: a very thin metal film directly over film region 300, and; a dielectric film directly over this very thin metal film. Alternatively, the dielectric film can be deposited directly over the film region 300.

Suitable thicknesses for the optional third blocker film region 305 generally range from 3-35 Å, 3-25 Å, or 3-18 Å. In certain embodiments, the third blocker film region 305 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the third infrared-reflection film region 300 as well.

Given the large number of blocker film regions provided in certain embodiments, it can be advantageous to use a very small thickness for one or more of the blocker film regions. Thus, in some embodiments, directly over at least one of the infrared-reflection film regions there is provided a blocker film region having a thickness of less than 20 Å, less than 15 Å, less than 7 Å, less than 6 Å, or even less than 5 Å. Further, in some embodiments, the coating 7 includes three blocker film regions 105, 205, 305, and the combined thickness of all three of these blocker film regions is less than less than 60 Å, less than 45 Å, less than 30 Å, less than 25 Å, less than 20 Å, less than 18 Å, or even less than 15 Å.

Moreover, certain embodiments provide the coating with a high combined thickness for the three infrared-reflection film regions (e.g., any combined thickness range noted herein) in combination with one or more (e.g., three) blocker film regions 105, 205, 305 of the dielectric or thin metal/dielectric type described above. These embodiments can provide an exceptional combination of good thermal insulating properties and high visible transmission.

The fourth transparent dielectric film region 80 (which may, though need not, be an outer coat) is located further from the substrate 12 than the third infrared-reflection film region 300. In some, though not all, embodiments, this film region 80 defines the coating's outermost face 77 (which face can optionally be exposed, i.e., not covered by any other film). The fourth transparent dielectric film region 80 can be a single layer of a single transparent dielectric material, or it can be a plurality of layers of different transparent dielectric materials. In some cases, the fourth transparent dielectric film region 80 comprises at least three transparent dielectric layers. Optionally, there are at least five, or even at least seven, such layers. As an alternative to using one or more discrete layers, part or all of the fourth transparent dielectric film region 80 can have a graded composition. The film region 80 can optionally include one or more absorbing dielectric and/or metal films, such as to control shading, color, or other optical properties.

Thus, it can be appreciated that the present coating 7 desirably includes at least four transparent dielectric film regions 20, 40, 60, 80. In some embodiments, the coating 7 comprises one or more, two or more, or even three or more nitride or oxynitride films, such as at least one, at least two, or even at least three films comprising silicon nitride and/or silicon oxynitride. In some embodiments of this nature, the coating 7 includes at least one nitride or oxynitride film (optionally comprising silicon nitride and/or silicon oxynitride) having a thickness of less than 150 angstroms, less than 140 angstroms, or even less than 125 angstroms (this type of convention globally meaning greater than zero), together with at least one other nitride or oxynitride film (optionally comprising silicon nitride and/or silicon oxynitride) having a thickness of greater than 50 angstroms, greater than 75 angstroms, greater than 100 angstroms, greater than 150 angstroms, or even greater than 175 angstroms. In some cases, the latter noted film is located either between the first 100 and second 200 infrared-reflection film regions or between the second 200 and third 300 infrared-reflection film regions. That is, it forms (or is part of) one of the spacer film regions. Desirably, the outermost film of the coating 7 comprises silicon nitride, as described in the exemplary method detailed below.

The total thickness of the present coating 7 can be varied to suit the requirements of different applications. In certain preferred embodiments, the total physical thickness of the coating 7 is greater than 1,750 angstroms, greater than 1,800 angstroms, greater than 1,900 angstroms, or even greater than 2,000 angstroms. For any embodiment disclosed in this specification, the coating's total thickness can optionally fall within any one or more of the ranges specified in this paragraph.

In one particular group of embodiments, the thickness of the third infrared-reflection film region 300 is greater than the thickness of the second infrared-reflection film region 200, and the thickness of the second infrared-reflection film region 200 is greater than the thickness of the first infrared-reflection film region 100. This group of embodiments is advantageous in terms of providing good reflected color properties. In one subgroup of these embodiments, the first 100, second 200, and third 300 infrared-reflection film regions each comprise (or consist essentially of) silver. Optionally, the coating 7 also has a metal/dielectric ratio within one or more of the ranges described above.

For purposes of the present specification, the first reflection-region ratio is defined as being the thickness of the first infrared-reflection film region 100 over the thickness of the second infrared-reflection film region 200, and the second reflection-region ratio is defined as being the thickness of the second infrared-reflection film region 200 over the thickness of the third infrared-reflection film region 300. In some particular embodiments, at least one of the first and second reflection-region ratios is less than 0.85, less than 0.83, or even less than 0.80. Optionally, the first and second reflection-region ratios are both less than 0.83, such as about 0.819 and 0.723 respectively.

In some embodiments of the present group, the thickness of at least one of the infrared-reflection film regions 100, 200, 300 is greater than 150 Å, greater than 175 Å, or even greater than 200 Å. Additionally or alternatively, the first, second, and third infrared-reflection film regions can optionally have a combined thickness of greater than 425 Å, greater than 450 Å, greater than 460 Å, greater than 475 Å, or even greater than 485 Å. In certain embodiments, this combined thickness is about 477 Å. For example, in some cases, the first, second, and third infrared-reflection film regions 100, 200, 300 are silver layers having respective thicknesses of 122 Å, 149 Å, and 206 Å. In other embodiments, the combined thickness is about 492 Å. For example, in some cases, the first, second, and third infrared-reflection film regions 100, 200, 300 are silver layers having respective thicknesses of 128 Å, 157 Å, and 207 Å.

In some embodiments of the present group, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In certain embodiments, this desired total thickness is less than 195 angstroms, less than 190 angstroms, less than 175 angstroms, less than 165 angstroms, less than 145 angstroms, or even less than 140 angstroms.

For purposes of this disclosure, the primary dielectric-region ratio is defined as being the thickness of the first transparent dielectric film region 20 over the thickness of the fourth transparent dielectric film region 80. This ratio can advantageously be less than 0.75, or even less than 0.6, while at the same time optionally being greater than 0.34, greater than 0.35, greater than 0.37, or even greater than 0.40. In one exemplary embodiment, this ratio is about 0.47. A primary dielectric-region ratio within any one or more of these ranges can optionally be adopted for any embodiment of the present group, or for any other embodiment disclosed in this specification (e.g., in combination with one or more of the optional ranges noted for the metal/dielectric ratio).

Certain embodiments of the invention provide a particular ratio for the combined thickness of the first transparent dielectric film region 20 (which may be the base coat, i.e., the dielectric film region closest to the substrate) and the fourth transparent dielectric film region 80 (which may be the outer coat) divided by the combined thickness of the second 40 and third 60 transparent dielectric film regions (which may be the first and second spacer layers, respectively). In these embodiments, this ratio preferably is greater than about 0.43, greater than about 0.45, or even greater than about 0.475. Coatings having this arrangement of dielectric thickness have been found to facilitate excellent properties, including good color, high visible transmission, etc., even when large amounts of infrared-reflection film is used.

Table 1 below shows one exemplary film stack that can be used as the present coating 7:

TABLE 1

| FILM | STACK A |
|---|---|
| TiO2 | 132 Å |
| Ag | 122 Å |
| Ti | 20 Å |
| TiO2 | 468 Å |
| Ag | 149 Å |
| Ti | 20 Å |
| TiO2 | 546 Å |
| Ag | 206 Å |
| Ti | 20 Å |
| TiO2 | 280 Å |

Table 2 below illustrates three more exemplary film stacks that can be used as the present coating 7:

TABLE 2

| FILM | STACK B | STACK C | STACK D |
|---|---|---|---|
| SnO2 | 165 Å | 164 Å | 164 Å |
| Ag | 117 Å | 117 Å | 117 Å |
| Ti | 20 Å | 20 Å | 30 Å |
| SnO2 | 591 Å | 592 Å | 591 Å |

TABLE 2-continued

| FILM | STACK B | STACK C | STACK D |
|---|---|---|---|
| Ag | 154 Å | 147 Å | 154 Å |
| Ti | 20 Å | 20 Å | 35 Å |
| SnO2 | 665 Å | 665 Å | 665 Å |
| Ag | 206 Å | 208 Å | 206 Å |
| Ti | 20 Å | 20 Å | 35 Å |
| SnO2 | 314 Å | 314 Å | 310 Å |

Table 3 below illustrates a further exemplary film stack that can be used, perhaps as a temperable coating, as the present coating 7. Here, the coating is representative of a class of embodiments wherein a triple silver coating is provided with at least about 50 angstroms (such as about 100 Å) of film comprising silicon dioxide directly on the substrate.

TABLE 3

| FILM | THICKNESS |
|---|---|
| SiO2 | >50 Å |
| Zn + O | 164 Å |
| Ag | 130 Å |
| Ti | 35 Å |
| Zn + O | 599 Å |
| Ag | 165 Å |
| Ti | 35 Å |
| Zn + O | 667 Å |
| Ag | 218 Å |
| Ti | 35 Å |
| Zn + O | 313 Å |

Table 4 below illustrates another exemplary film stack that can be used, perhaps as a temperable coating, as the present coating 7:

TABLE 4

| FILM | THICKNESS |
|---|---|
| SiO2 | >50 Å |
| Zn + O | 165 Å |
| Ag | 135 Å |
| Ti | 35 Å |
| Zn + O | 626 Å |
| Ag | 171 Å |
| Ti | 35 Å |
| Zn + O | 693 Å |
| Ag | 225 Å |
| Ti | 35 Å |
| Zn + O | 319 Å |

Table 4 is representative of a class of embodiments wherein a low-emissivity coating includes three infrared-reflective films having a combined thickness of at least about 525 angstroms. In addition, the outermost two infrared-reflective films in such embodiments can optionally have a combined thickness of at least about 385 angstroms.

The present invention includes methods of producing a coated substrate, e.g., a coated glass pane. In accordance with the present methods, a substrate 12 having a surface (e.g., a major surface) 18 is provided. If desired, this surface 18 can be prepared by suitable washing or chemical preparation. The present coating 7 is deposited on the surface 18 of the substrate 12, e.g., as a series of discrete layers, as a thickness of graded film, or as a combination including at least one discrete layer and at least one thickness of graded film. The coating can be deposited using any suitable thin film deposition technique. One preferred method utilizes magnetron sputtering, which is commonly used in industry. Reference is made to Chapin's U.S. Pat. No. 4,166,018, the teachings of which are incorporated herein by reference.

Briefly, magnetron sputtering involves transporting a substrate through a series of low pressure zones (or "chambers" or "bays") in which the various film regions that make up the coating are sequentially applied. Metallic film is sputtered from metallic sources or "targets," typically in an inert atmosphere such as argon. To deposit transparent dielectric film, the target may be formed of the dielectric itself (e.g., zinc aluminum oxide or titanium oxide). More commonly, though, the dielectric film is applied by sputtering a metal target in a reactive atmosphere. To deposit zinc oxide, for example, a zinc target can be sputtered in an oxidizing atmosphere; silicon nitride can be deposited by sputtering a silicon target (which may be doped with aluminum or the like to improve conductivity) in a reactive atmosphere containing nitrogen gas. The thickness of the deposited film can be controlled by varying the speed of the substrate and/or by varying the power on the targets.

Another method for depositing thin film on a substrate involves plasma chemical vapor deposition. Reference is made to U.S. Pat. No. 4,619,729 (Johncock et al.) and U.S. Pat. No. 4,737,379 (Hudgens et al.), the teachings of both of which concerning CVD techniques are incorporated herein by reference. Such plasma chemical vapor deposition involves the decomposition of gaseous sources via a plasma and subsequent film formation onto solid surfaces, such as glass substrates. The film thickness can be adjusted by varying the speed of the substrate as it passes through a plasma zone and/or by varying the power and/or gas flow rate within each zone.

Figure 6:
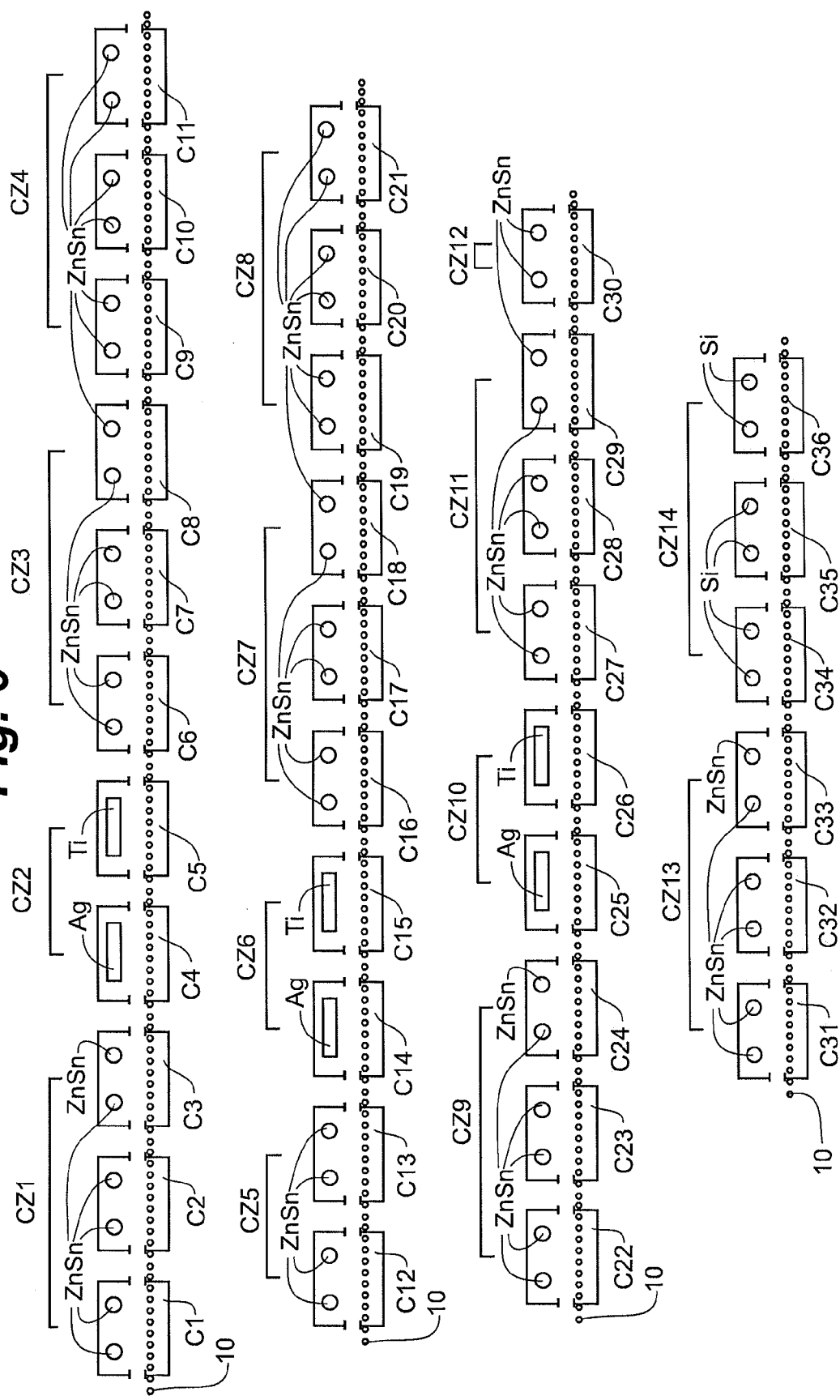
FIG. 6 is a schematic cross-sectional side view of a coater used in certain embodiments of the invention.

Turning now to FIG. 6, there is depicted an exemplary method for depositing a high infrared reflection coating 7 in accordance with certain embodiments of the invention. The coater shown schematically in FIG. 6 is used to deposit a coating 7 that includes, in sequence from the major surface 18 outward, a first transparent dielectric film region 20 comprising zinc tin oxide, a first infrared-reflection film region 100 comprising silver, a first blocker film region 105 comprising titanium, a second transparent dielectric film region 40 comprising zinc tin oxide, a second infrared-reflection film region 200 comprising silver, a second blocker film region 205 comprising titanium, a third transparent dielectric film region 60 comprising zinc tin oxide, a third infrared-reflection film region 300 comprising silver, a third blocker film region 305 comprising titanium, and a fourth transparent dielectric film region 80 that includes an outermost layer comprising silicon nitride over a layer comprising zinc tin oxide.

With continued reference to FIG. 6, the substrate 12 is positioned at the beginning of the coater and conveyed into the first coat zone CZ1 (e.g., by conveying the substrate along transport rollers 10). This coat zone CZ1 is provided with three sputtering chambers (or "bays"), C1 through C3, which are adapted collectively to deposit a first transparent dielectric film region 20 comprising zinc tin oxide. All three of these bays are provided with sputtering targets comprising a compound of zinc and tin. Each of these bays is illustrated as having two cylindrical sputtering targets, although the number and type (e.g., cylindrical versus planar) can be varied as desired. These first six targets are sputtered in an oxidizing atmosphere to deposit the first transparent dielectric film region 20 in the form of an oxide film comprising zinc and tin. The oxidizing atmosphere here can consist essentially of oxygen (e.g., about 100% $O_2$) at a pressure of about $4 \times 10^{-3}$ mbar. Alternatively, this atmosphere may comprise argon and oxygen. With reference to Table 4 below, a power of about 36.7 kW is applied to the first two targets, a power of about 34.6 kW is applied to the second two targets, and a power of about 35.5 kW is applied to the third two targets. The substrate 12 is conveyed beneath all six of these targets at a rate of about 310 inches per minute, while sputtering each target at the noted power level, thereby depositing the first transparent dielectric film region 20 in the form of an oxide film comprising zinc and tin and having a thickness of about 159 angstroms.

The substrate 12 is then conveyed into a second coat zone CZ2 wherein the first infrared-reflection film region 100 is applied directly over the first transparent dielectric film region 20. The second coat zone CZ2 is provided with an inert atmosphere (e.g., argon at a pressure of about $4 \times 10^{-3}$ mbar). The active sputtering bays C4 and C5 of this coat zone CZ2 each have a planar target, although the number and type of targets can be changed. The target in bay C4 is a metallic silver target, whereas the target in bay C5 is a metallic titanium target. The substrate is conveyed beneath the silver target at a rate of about 310 inches per minute, while sputtering this target at a power of about 7.1 kW, thereby depositing the first infrared-reflection film region 20 in the form of a silver film having a thickness of about 122 angstroms. The substrate is then conveyed beneath the titanium target in bay C5, while sputtering this target at a power of about 7.8 kW, thereby depositing a first blocker film region 105 in the form of a film comprising titanium and having a thickness of about 20 angstroms.

The substrate 12 is then conveyed through a third coat zone CZ3, a fourth coat zone CZ4, and a fifth coat zone CZ5, in which zones the second transparent dielectric film region 40 is applied in the form of an oxide film comprising zinc and tin. The third CZ3 and fourth CZ4 coat zones each have three active sputtering bays. The fifth coat zone CZ5 has two active sputtering bays (there may be unused bays and/or coat zones along the way). In each of the bays C6-C13, there are mounted two cylindrical targets each comprising (i.e., including a sputterable target material comprising) a compound of zinc and tin. Each of these sputtering bays C6-C13 is provided with an oxidizing atmosphere. For example, the oxidizing atmospheres in the third CZ3, fourth CZ4, and fifth CZ5 coat zones can each consist essentially of oxygen (e.g., about 100% $O_2$) at a pressure of about $4 \times 10^{-3}$ mbar. Alternatively, one or more of these atmospheres can comprise argon and oxygen.

As shown in Table 4 below, a power of about 50.2 kW is applied to the first two targets in the third coat zone CZ3, a power of about 45.1 kW is applied to the second two targets in this coat zone CZ3, and a power of about 49.5 kW is applied to the third two targets in this zone CZ3. Here, a power of about 53.1 kW is applied to the first two targets in the fourth coat zone CZ4, a power of about 47.7 kW is applied to the second two targets in this coat zone CZ4, and a power of about 44.8 is applied to the third two targets in this zone CZ4. Further, a power of about 49.0 kW is applied to the first two targets in the fifth coat zone CZ5, and a power of about 45.6 kW is applied to the second two targets in this coat zone CZ5. The substrate 12 is conveyed beneath all of the noted targets in coat zones 3-5 (i.e., CZ3 through CZ5), while conveying the substrate at a rate of about 310 inches per minute and sputtering each target at the noted power level, such that the second transparent dielectric film region 40 is applied in the form of an oxide film comprising zinc and tin and having a thickness of about 562 angstroms.

The substrate 12 is then conveyed into a sixth coat zone CZ6 wherein the second infrared-reflection film region 200 is applied directly over the second transparent dielectric film region 40. The sixth coat zone CZ6 has an inert atmosphere (e.g., argon at a pressure of about $4 \times 10^{-3}$ mbar). The sputtering bays C14, C15 in this coat zone CZ6 each have a planar target. The target in bay C14 is a metallic silver target, and the target in chamber C15 is a metallic titanium target. A power of about 8.9 kW is applied to the silver target, while the substrate is conveyed beneath this target at a rate of about 310 inches per minute, to deposit the second infrared-reflection film region 200 as a metallic silver film having a thickness of about 149 angstroms. The substrate is then conveyed (at the same speed) beneath the metallic titanium target in bay C15, with a power of about 8.1 kW being applied to this target, to deposit a second blocker film region 205 comprising titanium and having a thickness of about 20 angstroms.

The substrate 12 is then conveyed through a seventh coat zone CZ7, an eighth coat zone CZ8, and a ninth coat zone CZ9, wherein collectively the third transparent dielectric film region 60 is applied. Each of these coat zones has three sputtering bays, and each such bay is provided with two cylindrical targets (bays C16 through C18 are in CZ7, bays C19 through C21 are in CZ8, and bays C22 through C24 are in CZ9). The targets here all comprise a sputterable material that is a compound of zinc and tin. Each of these coat zones is provided with an oxidizing atmosphere consisting essentially of oxygen (e.g., about 100% $O_2$ at a pressure of about $4 \times 10^{-3}$ mbar). Alternatively, this atmosphere may comprise argon and oxygen.

A power of about 50.3 kW is applied to the first two targets in the seventh coat zone CZ7, a power of about 45.5 kW is applied to the second two targets in this coat zone CZ7, and a power of about 48.9 kW is applied to the third two targets in this zone CZ7. A power of about 52.5 kW is applied to the first two targets in the eighth coat zone CZ8, while a power of about 48.2 kW is applied to the second two targets in this coat zone CZ8, and a power of about 44.7 kW is applied to the third two targets in this zone CZ8. A power of about 49.0 kW is applied to the first two targets in the ninth coat zone CZ9, while a power of about 45.5 kW is applied to the second two targets in this coat zone CZ9, and a power of about 47.8 kW is applied to the third two targets in this zone CZ9. The substrate 12 is conveyed beneath all of these targets (i.e., beneath all of the targets in CZ7 through CZ9) at a rate of about 310 inches per minute, while sputtering each target at the noted power level, such that the third transparent dielectric film region 60 is applied as an oxide film comprising zinc and tin and having a thickness of about 655 angstroms.

The substrate 12 is then conveyed into a tenth coat zone CZ10 where the third infrared-reflection film region 300 is applied. This coat zone CZ10 contains an inert atmosphere (e.g., argon at a pressure of about $4 \times 10^{-3}$ mbar). The active bays C25, C26 in this coat zone CZ10 are each provided with a planar target. The target in bay C25 is a metallic silver target, and the target in bay C26 is a metallic titanium target. A power of about 12.6 kW is applied to the silver target, while the substrate is conveyed beneath this target at a rate of about 310 inches per minute, thereby depositing the third infrared-reflection film region 300 as a silver film having a thickness of about 206 angstroms. The substrate is then conveyed beneath the titanium target in chamber C26, while sputtering that target at a power level of about 8.1 kW, so as to deposit a third blocker film region 305 in the form of a film comprising titanium and having a thickness of about 20 angstroms.

The substrate 12 is then conveyed through an eleventh coat zone CZ11, a twelfth coat zone CZ12, and a thirteenth coat zone CZ13, wherein collectively there is deposited an inner portion of the fourth transparent dielectric film region 80. The eleventh coat zone C11 has three sputtering bays, each with two cylindrical targets (bays C27 through C29 are in CZ11). The twelfth coat zone C12 has only one active sputtering bay C30, and this bay C30 is provided with two cylindrical targets. The thirteenth coat zone CZ13 has three sputtering bays, each provided two cylindrical targets (bays C31 through C33 are in CZ13). Each of the noted targets in coat zones CZ11 through CZ13 comprises a sputterable target material that is a compound of zinc and tin. The coat zones CZ11 through CZ13 are all provided with oxidizing atmospheres, each consisting essentially of oxygen (e.g., about 100% $O_2$ at a pressure of about $4 \times 10^{-3}$ mbar). Alternatively, one or more of these atmospheres can comprise argon and oxygen.

A power of about 17.9 kW is applied to the first two targets in the eleventh coat zone CZ11, a power of about 21.1 kW is applied to the second two targets in this coat zone CZ11, and a power of about 19.6 kW is applied to the third two targets in this zone CZ11. A power of about 20.1 kW is applied to the two targets in the twelfth coat zone CZ12. A power of about 21.5 kW is applied to the first two targets in the thirteenth coat zone CZ13, a power of about 19.4 kW is applied to the second two targets in this coat zone CZ13, and a power of about 19.3 kW is applied to the third two targets in this zone CZ13. The substrate 12 is conveyed beneath all of the noted targets in CZ11 through CZ13 at a rate of about 310 inches per minute, while sputtering each of these targets at the noted power level, such that an inner portion of the fourth transparent dielectric film region 80 is applied as an oxide film comprising zinc and tin and having at a thickness of about 236 angstroms.

Finally, the substrate 12 is conveyed into a fourteenth coat zone CZ14, wherein the outermost portion of the fourth transparent dielectric film region 80 is applied. This coat zone CZ14 has three sputtering bays C34-C36, each containing a nitrogen atmosphere, optionally with some argon, at a pressure of about $4 \times 10^{-3}$ mbar. The sputtering bays C34 through C36 in this coat zone CZ14 are each provided with two cylindrical targets. Each of these targets comprises a sputterable target material of silicon with a small amount of aluminum. A power of about 31.9 kW is applied to the first two targets in the fourteenth coat zone CZ14, a power of about 34.0 kW is applied to the second two targets in this coat zone CZ14, and a power of about 37.4 kW is applied to the third two targets in this zone CZ14. The substrate 12 is conveyed beneath all of the targets in CZ14 at a rate of about 310 inches per minute, while sputtering each of these targets at the noted power level, such that the outermost portion of the fourth transparent dielectric film region 80 is applied as a nitride film comprising silicon and a small amount of aluminum and having a thickness of about 101 angstroms.

TABLE 5

| Bay | Power (kW) |
| --- | --- |
| C1 | 36.7 |
| C2 | 34.6 |
| C3 | 35.5 |
| C4 | 7.1 |
| C5 | 7.8 |
| C6 | 50.2 |
| C7 | 45.1 |
| C8 | 49.5 |

TABLE 5-continued

| Bay | Power (kW) |
| --- | --- |
| C9 | 53.1 |
| C10 | 47.7 |
| C11 | 44.8 |
| C12 | 49 |
| C13 | 45.6 |
| C14 | 8.9 |
| C15 | 8.1 |
| C16 | 50.3 |
| C17 | 45.5 |
| C18 | 48.9 |
| C19 | 52.5 |
| C20 | 48.2 |
| C21 | 44.7 |
| C22 | 49 |
| C23 | 45.5 |
| C24 | 47.8 |
| C25 | 12.6 |
| C26 | 8.1 |
| C27 | 17.9 |
| C28 | 21.1 |
| C29 | 19.6 |
| C30 | 20.1 |
| C31 | 21.5 |
| C32 | 19.4 |
| C33 | 19.3 |
| C34 | 31.9 |
| C35 | 34 |
| C36 | 37.4 |

Figure 5:
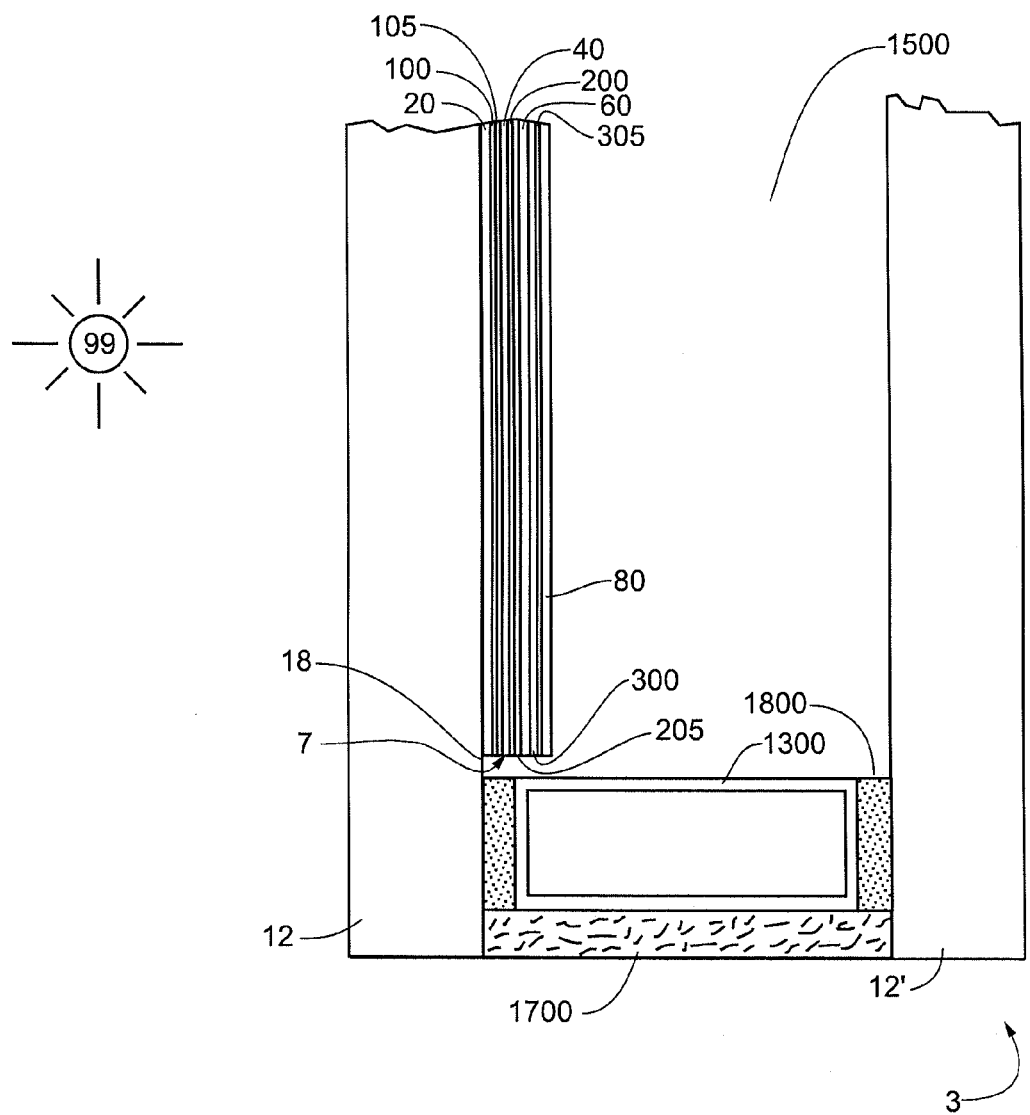
FIG. 5 is a schematic partially broken-away cross-sectional side view of a multiple-pane insulating glazing unit bearing a high infrared reflection coating in accordance with certain embodiments of the invention.

FIG. 5 schematically depicts a multiple-pane insulating glazing unit bearing a multiple cavity low-emissivity coating in accordance with certain embodiments of the invention. Here, the multiple cavity low-emissivity coating 7 is on the #2 surface of the IG unit 3, and the #1 surface is exposed to an outdoor environment. The IG unit here includes a spacer 1300 adhered between the two panes 12, 12' by two deposits of sealant 1700, 1800. The spacer can alternatively be an integral part of a sash, frame, etc. Moreover, a single deposit of sealant can alternatively be used. In embodiments of this nature, the IG unit preferably is mounted on a sash and/or frame that maintains the IG unit in the illustrated/noted configuration.

While some preferred embodiments of the invention have been described, it should be understood that various changes, adaptations and modifications may be made therein without departing from the spirit of the invention and the scope of the appended claims.

What is claimed is:

1. A transparent substrate having two generally opposed major surfaces, wherein a multiple cavity low-emissivity coating is provided on a desired one of the major surfaces, the coating comprising, in sequence from said desired major surface outward:
    a) a first transparent dielectric film region;
    b) a first infrared-reflection film region;
    c) a second transparent dielectric film region;
    d) a second infrared-reflection film region;
    e) a third transparent dielectric film region;
    f) a third infrared-reflection film region;
    g) a fourth transparent dielectric film region;
wherein the transparent substrate is part of a multiple-pane insulating glazing unit that includes a second pane, wherein the insulating glazing unit has at least one between-pane space, said desired major surface being exposed to a between-pane space of the insulating glazing unit, wherein the coating has a metal/dielectric ratio of at least 0.22 and yet the insulating glazing unit has a visible transmittance of 0.65 or more, the metal/dielectric ratio being defined as the combined thickness of the first, second, and third infrared-reflection film regions divided by the combined thickness of the first, second, third, and fourth transparent dielectric film regions, the coating having a primary dielectric-region ratio of less than 0.75, the primary dielectric-region ratio being defined as the thickness of the first transparent dielectric film region divided by the thickness of the fourth transparent dielectric film region.

2. The transparent substrate of claim 1 wherein the metal/dielectric ratio is at least 0.25.

3. The transparent substrate of claim 2 wherein the metal/dielectric ratio is at least at least 0.27.

4. The transparent substrate of claim 1 where the three infrared-reflection film regions have a combined thickness of greater than 470 angstroms.

5. The transparent substrate of claim 1 wherein the visible transmittance is 0.66 or more.

6. The transparent substrate of claim 1 wherein the-multiple-pane insulating glazing unit has an exterior reflected color characterized by an $a_h$ color coordinate of between about +1.5 and about −2 and a $b_h$ color coordinate of between about 0 and about −3.

7. The transparent substrate of claim 1 wherein the multiple-pane insulating glazing unit has a solar heat gain coefficient of less than 0.29.

8. The transparent substrate of claim 7 wherein the solar heat gain coefficient is less than 0.28.

9. The transparent substrate of claim 8 wherein the solar heat gain coefficient is 0.27 or less.

10. The transparent substrate of claim 7 wherein the insulating glazing unit has an exterior reflected color characterized by an $a_h$ color coordinate of between about +1.5 and about −2 and a $b_h$ color coordinate of between about 0 and about −3.

11. The transparent substrate of claim 10 wherein the solar heat gain coefficient is 0.27 or less.

12. A transparent substrate having two generally opposed major surfaces, wherein a multiple cavity low-emissivity coating is provided on a desired one of the major surfaces, the coating comprising, in sequence from said desired major surface outward:
 a) a first transparent dielectric film region;
 b) a first infrared-reflection film region;
 c) a second transparent dielectric film region;
 d) a second infrared-reflection film region;
 e) a third transparent dielectric film region;
 f) a third infrared-reflection film region;
 g) a fourth transparent dielectric film region;
wherein the coating has a metal/dielectric ratio of at least 0.25, the metal/dielectric ratio being defined as the combined thickness of the first, second, and third infrared-reflection film regions divided by the combined thickness of the first, second, third, and fourth transparent dielectric film regions, wherein the transparent substrate is part of a multiple-pane insulating glazing unit that includes a second pane, wherein the insulating glazing unit has at least one between-pane space, said desired major surface being exposed to a between-pane space of the insulating glazing unit, the insulating glazing unit having an exterior reflected color characterized by an $a_h$ color coordinate of between about +1.5 and about −2 and a $b_h$ color coordinate of between about 0 and about −3, wherein the second infrared-reflection film region is thicker than the first infrared-reflection film region by at least 30 angstroms, and wherein between the first infrared-reflection film region and said major surface of the substrate there is a desired total thickness of transparent dielectric film having a refractive index of 1.7 or greater, said desired total thickness being less than 195 angstroms, wherein the three infrared-reflection film regions have a combined thickness of greater than 470 angstroms, and wherein the insulating glazing unit has a visible transmittance of 0.65 or more.

13. The transparent substrate of claim 12 wherein the visible transmittance is 0.66 or more.

14. The transparent substrate of claim 12 wherein the exterior reflected color of the insulating glazing unit is characterized by an $a_h$ color coordinate of between about +1 and about −1 and a $b_h$ color coordinate of between about −0.5 and about −2.5.

15. The transparent substrate of claim 12 wherein the combined thickness of the three infrared-reflection film regions is greater than 485 angstroms.

16. A transparent substrate having two generally opposed major surfaces, wherein a multiple cavity low-emissivity coating is provided on a desired one of the major surfaces, the coating comprising, in sequence from said desired major surface outward:
 a) a first transparent dielectric film region;
 b) a first infrared-reflection film region;
 c) a second transparent dielectric film region;
 d) a second infrared-reflection film region;
 e) a third transparent dielectric film region;
 f) a third infrared-reflection film region;
 g) a fourth transparent dielectric film region;
wherein the coating has a metal/dielectric ratio of at least 0.25, the metal/dielectric ratio being defined as the combined thickness of the first, second, and third infrared-reflection film regions divided by the combined thickness of the first, second, third, and fourth transparent dielectric film regions, wherein the transparent substrate is part of a multiple-pane insulating glazing unit that includes a second pane, wherein the insulating glazing unit has at least one between-pane space, said desired major surface being exposed to a between-pane space of the insulating glazing unit, wherein the coating has a sheet resistance of less than 1.4 ohms/square and yet the insulating glazing unit has a visible transmittance of 0.65 or more, wherein the second infrared-reflection film region is thicker than the first infrared-reflection film region by at least 30 angstroms, and wherein between the first infrared-reflection film region and said major surface of the substrate there is a desired total thickness of transparent dielectric film having a refractive index of 1.7 or greater, said desired total thickness being less than 195 angstroms.

17. The transparent substrate of claim 16 wherein the three infrared-reflection film regions have a combined thickness of greater than 470 angstroms, the third infrared-reflection film region has a thickness that is greater than a thickness of the second infrared-reflection film region, and the second infrared-reflection film region has a thickness that is greater than a thickness of the first infrared-reflection film region.

18. The transparent substrate of claim 17 wherein the combined thickness of the three infrared-reflection film regions is greater than 485 angstroms.

19. The transparent substrate of claim 18 wherein the visible transmittance is 0.66 or more.

20. The transparent substrate of claim 18 wherein the insulating glazing unit has an exterior reflected color characterized by an $a_h$ color coordinate of between about +1.5 and about −2 and a $b_h$ color coordinate of between about 0 and about −3.

21. The transparent substrate of claim 16 wherein the coating has a base/outer ratio of greater than about 0.45, the base/outer ratio being defined as a combined thickness of the first and fourth transparent dielectric film regions divided by a combined thickness of the second and third transparent dielectric film regions.

22. The transparent substrate of claim 21 wherein the base/outer ratio is greater than about 0.475.

* * * * *